United States Patent
Ta

(10) Patent No.: US 6,903,940 B2
(45) Date of Patent: Jun. 7, 2005

(54) EXTERIOR FRONT PANEL ASSEMBLY FOR ACCOMMODATING AND STRENGTHENING A COMPUTER CARD ASSEMBLY

(75) Inventor: Peter Cuong Dac Ta, Hayward, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 32 days.

(21) Appl. No.: 10/259,919

(22) Filed: Sep. 27, 2002

(65) Prior Publication Data

US 2004/0062018 A1 Apr. 1, 2004

(51) Int. Cl.[7] .............................................. H01R 12/16
(52) U.S. Cl. ...................... 361/788; 361/760; 361/740; 361/732; 174/35
(58) Field of Search ................................. 361/788, 801, 361/760, 818, 816, 725, 732, 740, 686; 174/35, 51 R

(56) References Cited

U.S. PATENT DOCUMENTS 5,293,303 A * 3/1994 Fletcher et al. ............. 361/798
5,319,524 A * 6/1994 Welch et al. ................ 361/754
5,986,892 A * 11/1999 Hargy, III ................... 361/759
6,570,770 B1 * 5/2003 Ross et al. .................. 361/752

* cited by examiner

Primary Examiner—David Martin
Assistant Examiner—Hung S. Bui
(74) Attorney, Agent, or Firm—Meyertons Hood Kivlin Kowert & Goetzel, P.C.; NoëL Kivlin

(57) ABSTRACT

The present invention is related to a Compact Peripheral Component Interconnect (cPCI) front panel assembly that is adapted to keep its corresponding cPCI front card's printed circuit board from bending. The cPCI front panel assembly should make its corresponding printed circuit board stronger to prevent circuit board damage and to maintain the cPCI front card envelope standard even before the card is inserted into the card slot. The front panel assembly should be stronger than its corresponding cPCI front card's circuit board. The front panel couples its stronger strength with its weaker circuit board. In addition, the front panel assembly prevents the bending of its corresponding circuit board at the upper, middle, and lower portions. The present invention provides the important advantage of protecting the cPCI front card even before the card is inserted into a card cage.

20 Claims, 5 Drawing Sheets

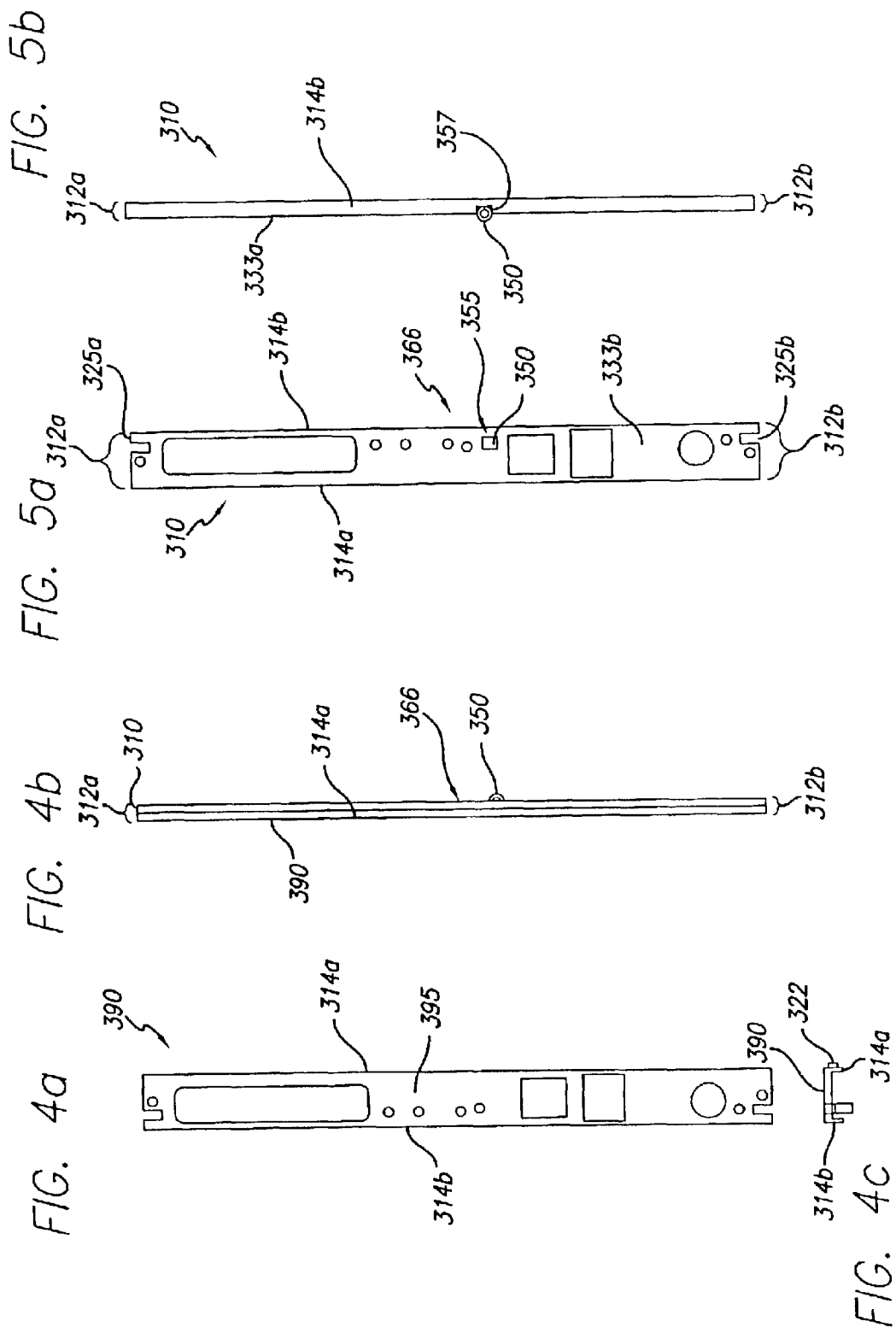

EXTERIOR FRONT PANEL ASSEMBLY FOR ACCOMMODATING AND STRENGTHENING A COMPUTER CARD ASSEMBLY

BACKGROUND OF THE INVENTION

1. Field of the Invention

The present invention relates to a Compact Peripheral Component Interconnect (cPCI) system. More particularly, the present invention relates to a front panel assembly for the exterior of a cPCI front card.

2. Description of Related Art cPCI is a high performance industrial bus based on the standard cPCI electrical specification in rugged 3U or 6U Eurocard packaging. cPCI is intended for application in telecommunications, computer telephony, real-time machine control, industrial automation, real-time data acquisition, instrumentation, military systems or any other application requiring high speed computing, modular and robust packaging design, and long term manufacturer support. Because of its high speed and bandwidth, the cPCI bus is particularly well suited for many high-speed data communication applications such as servers, routers, converters, and switches.

Compared to a standard desktop PCI system, a cPCI system supports twice as many PCI slots (typically 8 versus 4) and offers an ideal packaging scheme for industrial applications. Conventional cPCI front cards (front cards) are designed for front loading and removal from a card cage. Typically the front cards provide substantially all features and functions (i.e., clocking, arbitration, configuration, and interrupt processing) of the cPCI system. A corresponding rear transition card is typically coupled to each of the front cards. The rear transition card allows access to the features and functions of the front card by providing the input/output ports, such as serial or parallel ports.

A typical cPCI front card is firmly held in position by its front panel assembly and side card guide(s) on a card cage. The front panel assembly includes pin-and-socket connectors(s) that solidly connects the front card into the card cage. The front card is mounted vertically to allow for natural or forced air convection for cooling. In the attached position, the front panel assembly serves to seal and protect the front card within the card cage.

The conventional front cards are constructed mainly from a relatively thin printed circuit board (approximately 3.70 mm) that can be bent easily. The inadvertent bending of a printed circuit board on a cPCI front card can damage the front card and in turn damage the functions and features of the cPCI system. In addition, the deflection of the front card may violate the cPCI card envelope dimensions. The envelope dimensions are an industry standard that defines the required width, length and thickness of a cPCI card (e.g., the standard in the PICMG 2.0 cPCI specification). A violation of the cPCI card envelope standard, for example, may prevent a cPCI front card from being properly inserted into its corresponding cPCI slot.

Accordingly, it would be desirable to provide a cPCI front panel assembly that can prevent a cPCI front card from deflecting before the card is in the attached position. That is, it would be desirable to provide a cPCI front panel assembly that makes the cPCI front card stronger to prevent card damage and deflection. In addition, it would be desirable to provide a front panel assembly that is stronger than its corresponding cPCI front card's circuit board.

SUMMARY OF THE INVENTION

The present invention relates to a cPCI front panel assembly that is adapted to keep its corresponding cPCI front card's printed circuit board from deflecting. The front panel assembly makes its corresponding printed circuit board stronger to prevent circuit board damage and to maintain the cPCI front card envelope dimensions even before the card is inserted into a card cage. The front panel should couple its strength with its weaker circuit board. The front panel assembly should also prevent the bending of its corresponding circuit board at the upper, middle, and lower portions. The present invention provides the important advantage of protecting the cPCI front card even before the card is inserted into the card cage.

In an embodiment of the invention, a cPCI front panel assembly includes a front panel having a first end and a second end. A first handle is connected with the first end. A second handle is connected with the second end. A first board retainer portion is located on the first handle. The first board retainer portion is for attaching with an upper portion of a circuit board of a front card. A second board retainer portion is located on the second handle. The second board retainer portion is for attaching with a lower portion of the circuit board. A board bracket is located around a middle portion of the front panel. The board bracket has an extended portion for attaching with a middle portion of the circuit board.

In addition, the front panel has a slot located around the middle portion of the front panel. The slot is dimensioned for press fitting with an anchor portion of the board bracket. The board bracket is attached to the front panel by press fitting the anchor portion into the slot. The anchor portion and the extended portion are located on opposite ends of the board bracket.

In another embodiment of the invention, a front panel having more strength than the circuit board is provided to a cPCI front panel assembly. A bracket slot is positioned on a middle portion of the front panel. An extended portion is provided on a first end of the board bracket. An anchor portion is provided on a second end of the board bracket. A first handle and a second handle are respectively connected on a first end and a second end of the front panel. An upper portion of a circuit board of a front card is attached to a first retainer portion on the first handle. A lower portion of the circuit board is attached to a second retainer portion on the second handle. The anchor portion of the board bracket is press fitted into the bracket slot. A middle portion of the circuit board is attached to the extended portion of the board bracket.

In yet another embodiment of the invention, a cPCI front panel assembly includes a front panel having a first end, a second end, and a middle portion. The first end attaches with an upper portion of a circuit board of a front card. The second end attaches with a lower portion of the circuit board. A board bracket attaches with the front panel. The board bracket has an extended portion and an anchor portion. The extended portion attaches with a middle portion of the circuit board.

In addition, the extended portion and the anchor portion are located on opposite ends of said board bracket. The front panel is stronger than the circuit board. The front panel has a rectangular shaped slot located below the middle portion of the front panel. The board bracket is attached to the front panel by press fitting the anchor portion into the rectangular shaped slot. The extended portion has a screw hole for insertion by a board retainer screw. The extended portion is attached to the middle portion of the circuit board by inserting the board retainer screw into the screw hole and a clearance hole on the middle portion of the circuit board.

A more complete understanding of the present invention will be afforded to those skilled in the art, as well as a realization of additional advantages and objects thereof, by a consideration of the following detailed description of the embodiment. Reference will be made to the appended sheets of drawings, which will first be described briefly.

BRIEF DESCRIPTION OF THE DRAWINGS

The drawings illustrate the design and utility of preferred embodiments of the invention. The components in the drawings are not necessarily to scale, emphasis instead being placed upon illustrating the principles underlying the embodiment. Moreover, in the drawings, like reference numerals designate corresponding parts throughout the different views.

FIG. 4(a) shows a front face view of a silkscreen of a front panel assembly according to an embodiment of the invention;

FIG. 4(b) shows a right side view of the of a front panel of FIG. 4(a);

FIG. 4(c) shows a bottom side view of the front panel of FIG. 4(b);

FIG. 5(a) shows a back face view of a front panel according to an embodiment of the invention;

FIG. 5(b) shows a left side view of the front panel of FIG. 5(a);

DETAILED DESCRIPTION

The present invention relates to a cPCI front panel assembly that is adapted to keep its corresponding front card's printed circuit board from bending. The front panel assembly should make its corresponding front card stronger to prevent card damage and to maintain the cPCI card envelope standard before the card is inserted into the card cage.

Figure 1:
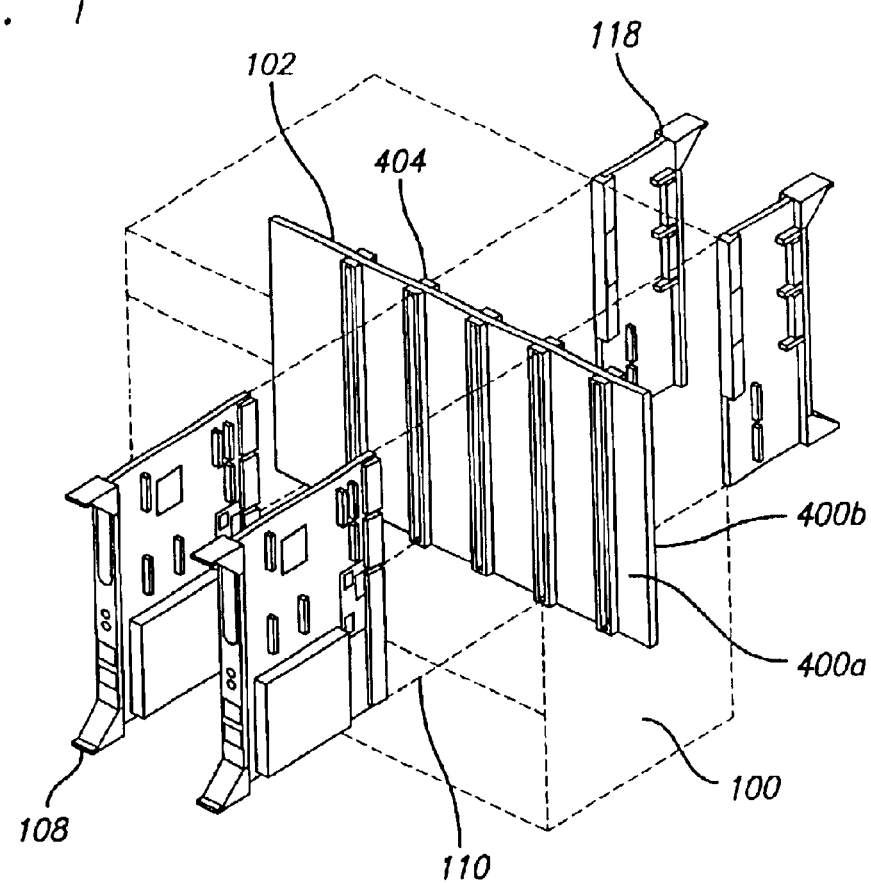
FIG. 1 is an exploded perspective view of a cPCI chassis system according to an embodiment of the invention.

Referring to FIG. 1, there is shown an exploded perspective view of a cPCI chassis system as envisioned in an embodiment of the present invention. The chassis system 100 includes a cPCI backplane 102. The backplane 102 is located within chassis 100 and front cards can only be inserted from the front of the chassis 100. The front side 400a of the backplane 102 has slots provided with connectors 404. A corresponding transition card 118 is coupled to the front card 108 via backplane 102. The backplane 102 contains corresponding slots and connectors (not shown) on its backside 400b to mate with transition card 118. In the chassis system 100 that is shown, a front card 108 may be inserted into appropriate slots and mated with the connectors 404. For proper insertion of the front card 108 into the slot, card guides 110 are provided. This cPCI chassis system 100 provides front removable front cards and unobstructed cooling across the entire set of front cards. The cPCI system is also connected to a power supply (not shown) that supplies power to the cPCI system.

Figure 2:
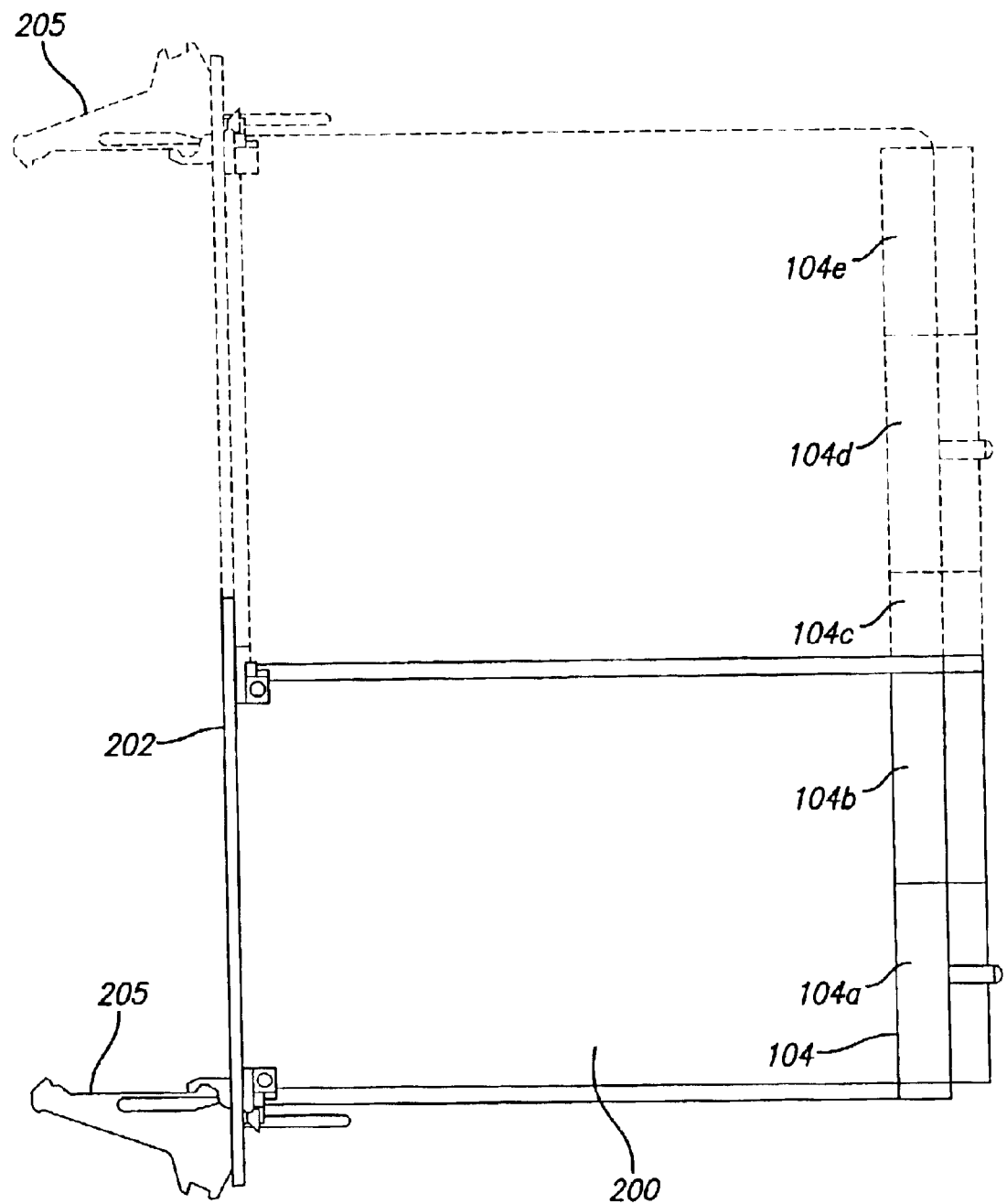
FIG. 2 shows the form factors that are defined for the cPCI front card.

Referring to FIG. 2, there are shown the form factors defined for the cPCI front card, which is based on the PICMG cPCI industry standard (e.g., the standard in the PICMG 2.0 cPCI specification). As shown in FIG. 2, the front card 200 has a front panel assembly 202 that includes ejector/injector handles 205. The front panel assembly 202 is consistent with PICMG cPCI packaging and is compliant with IEEE 1101.1 or IEEE 1101.10. The ejector/injector handles should also be compliant with IEEE 1101.1. Two ejector/injector handles 205 are used for the 6U front cards in the present invention. The connectors 104a–104e of the front card 200 are numbered starting from the bottom connector 104a, and the 6U front card size is defined, as described below.

The dimensions of the 3U form factor are approximately 160.00 mm by approximately 100.00 mm, and the dimensions of the 6U form factor are approximately 160.00 mm by approximately 233.35 mm. The 3U form factor includes two 2 mm connectors 104a–104b and is the minimum as it accommodates the full 64 bit cPCI bus. Specifically, the 104a connectors are reserved to carry the signals required to support the 32-bit PCI bus; hence, no other signals may be carried in any of the pins of this connector. Optionally, the 104a connectors may have a reserved key area that can be provided with a connector "key," which is a pluggable plastic piece that comes in different shapes and sizes, so that the add-on card can only mate with an appropriately keyed slot. The 104b connectors are defined to facilitate 64-bit transfers or for rear panel I/O in the 3U form factor. The 104c–104e connectors are available for 6U systems as also shown in FIG. 2. The 6U form factor includes the two connectors 104a–104b of the 3U form factor, and three additional 2 mm connectors 104c–104e. In other words, the 3U form factor includes connectors 104a–104b, and the 6U form factor includes connectors 104a–104e. The three additional connectors 104c–104e of the 6U form factor can be used for secondary buses (i.e., Signal Computing System Architecture (SCSA) or MultiVendor Integration Protocol (MVIP) telephony buses), bridges to other buses (i.e., Virtual Machine Environment (VME) or Small Computer System Interface (SCSI)), or for user specific applications. Note that the cPCI specification defines the locations for all the connectors 104a–104e, but only the signal-pin assignments for the cPCI bus portion 104a and 104b are defined. The remaining connectors are the subjects of additional specification efforts or can be user defined for specific applications, as described above.

FIGS. 3–6 show a front panel assembly 300 according to an embodiment of the present invention. The front panel assembly 300 has a front panel 310 that is formed from sheet metal or extruded aluminum. Aluminum is used because of its stiffness (or yield strength) to weight ratio (e.g., Aluminum has a higher yield strength to weight ratio than steel). The assembly 300 also is provided with a pair of ejector/injector handles: an upper ejector/injector handle 305a and a lower ejector/injector handle 305b. The ejector/injector handles 304a–b should be compliant with IEEE 1101.1.

The upper ejector/injector handle 305a has an upper pin-and-socket connector 315a and an upper board retainer portion 320a inserted into an upper retainer slot 325a located on the upper end 312a of the front panel 310. The upper board retainer portion 320a has an upper screw hole 330a. The upper screw hole 330a is designed to be inserted by an upper board screw 380a. The upper board screw 380a should be made from a M2.5×6 mm screw. The upper screw hole 330a should be threaded and dimensioned according to the dimension of the upper board screw 380a.

An upper portion of a printed circuit board of a cPCI front card (not shown) is coupled to the upper board retainer portion 320a via the upper board screw 380a inserted into the upper screw hole 330a and a clearance hole in the upper portion of the printed circuit board. The upper pin-and-socket connector 315a is designed to screw into a cPCI card cage after front panel assembly 300 and its associated printed circuit board has been inserted into the card cage. The upper ejector/injector handle 305a and the front panel 310 are held together by the upper front panel screw 370a.

Similarly, the lower ejector/injector handle 305b has a lower board retainer portion 320b that is inserted into a lower retainer slot 325b located on the lower end 312b of the front panel 310. The lower board retainer portion 320b has a lower screw hole 330b. The lower screw hole 330b is designed to be inserted by a lower board screw 380b.

A lower portion of the printed circuit board (not shown) is coupled to the lower board retainer portion 320b via the lower board screw 380b inserted into the lower screw hole 330b and a clearance hole in the lower portion of the printed circuit board. The lower ejector/injector handle 305b and the front panel 310 are held together by lower front panel screw 370b.

In this way, the upper and lower retainer portions 320a–b couple the strength of the front panel 310 (made from sheet metal) with the weaker circuit board of the cPCI front card to make the circuit board stronger. In addition, the upper and lower retainer portions 320a–b respectively prevent the cPCI front card from bending at the top and at the bottom.

Figure 3:
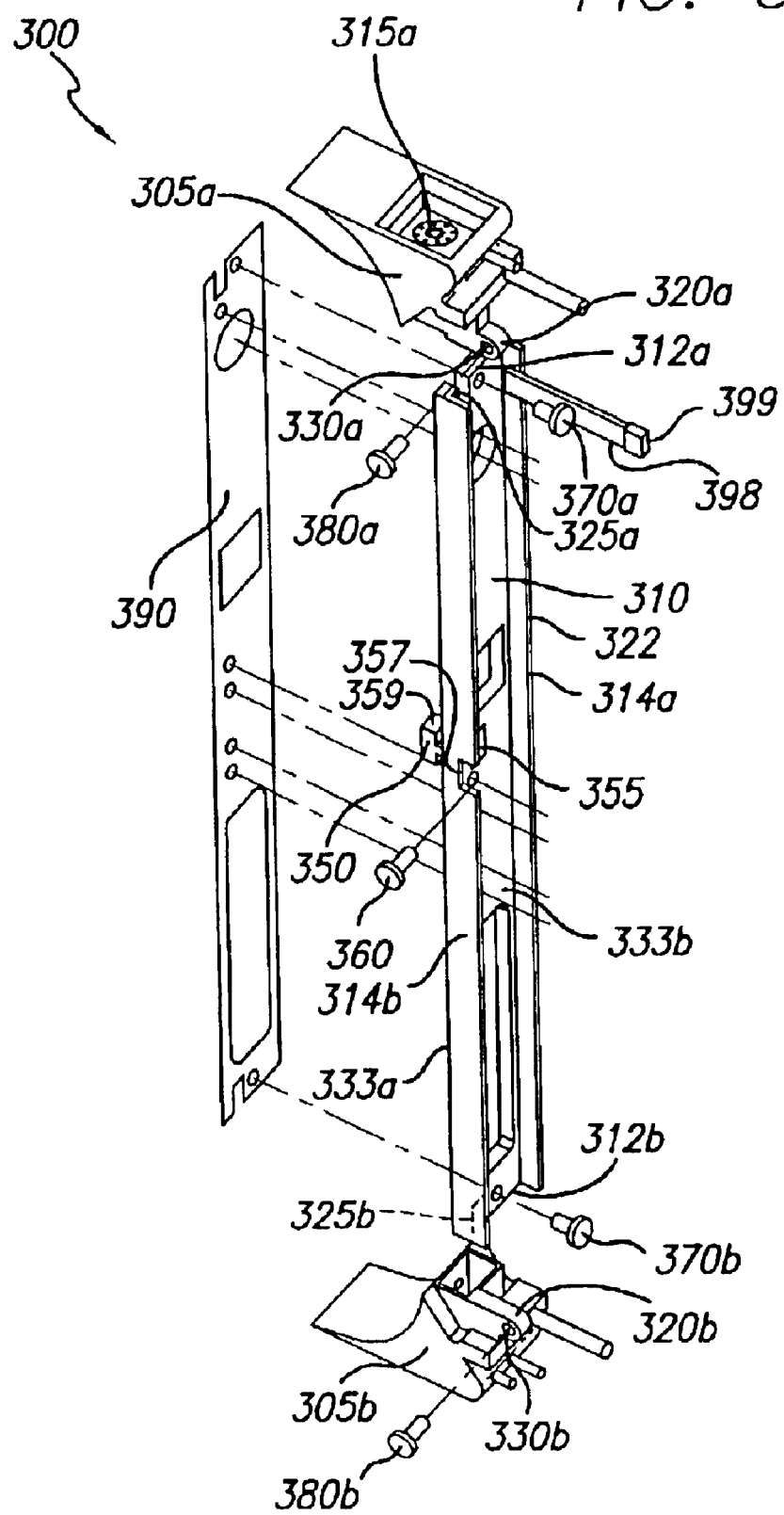
FIG. 3 is an exploded view of a cPCI front panel assembly according to an embodiment of the invention.

Referring now to FIG. 4(a), the front panel 310 has a silkscreen 390. The face portion 395 of the silkscreen 390 should be marked with black characters. The silkscreen 390 also should have no thickness or volume and should be formed by printing the necessary characters directly onto a front face side 333a of the front panel 310. (The front panel 310 also has a back face side 333b.) Optionally, in another embodiment of the present invention, the silkscreen 390 may be formed by a separate silkscreen panel. Referring not to FIGS. 3 and 4(h)–(c), the upper and lower front panel screws 370a–b may then be used to couple or laminate this optional silkscreen panel onto the front face side 333a of the front panel 310.

Referring now to FIGS. 3, 4(c) and 5–7, the front panel 310 is approximately 20.30 mm by approximately 240.40 mm. The front panel 310 also has a electric/magnetic interference (EMI) shield 322 and a middle bracket slot 355.

The EMI shield 322 further comprise a gasket made from any number of nickel plated materials or nickel beryllium copper materials. Because the front cards are placed side by side in a cPCI chassis system, only one EMI shield 322 is needed for each front panel assembly 300. In this embodiment, the EMI shield is located on a right side 314a of the front panel 310. The front panel 310 also has a left side 314b. Left side 314b is the side where the printed circuit board's back face comes to rest after the circuit board (the cPCI front card's circuit board) has been attached to the front panel 310.

The middle bracket slot 355 should be a rectangular slot located in the middle of the front panel. The middle bracket slot 355 may be set slightly above or below the exact middle position 366 of the front panel 310 so as not to hamper other components on the panel 310. In this embodiment, the middle bracket slot is placed approximately 103.23 mm above the lower end 312b of the front panel 310. Because of the thickness of the cPCI front card printed circuit board, the middle bracket slot 355 should also be placed approximately 3.70 mm away from the left side 314b of the front panel 310.

The middle bracket slot 355 is also dimensioned to be inserted by a board retainer bracket 350. The board retainer bracket 350 is inserted into bracket slot 355 by pressing the board retainer bracket 350 into the rectangular slot 355. This attachment method is commonly referred to as an interference fit, press fit, or swage fit. The rectangular shape of the bracket slot 355 prevents unintended rotational movements of the press fitted board retainer bracket 350. It should be appreciated that other attachment methods and bracket slot shapes known to those skill in the art may also be used.

Figure 7:
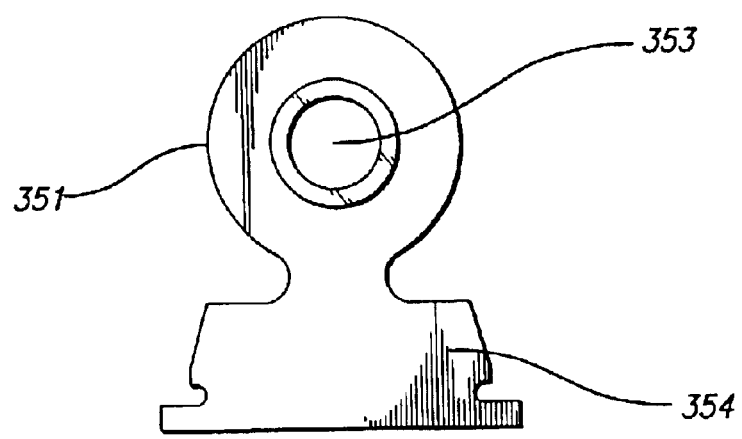
FIG. 7 shows a side view of a retainer bracket according to an embodiment of the invention.

Referring now also to FIG. 7, in this embodiment, the retainer bracket 350 is provided with an extended portion 351 having a threaded hole 353 for a board retainer screw 360. The board retainer screw 360 should be made from a M3×6 mm pan slot screw. The threaded hole 353 should be an M3 thread. The retainer bracket 350 is also provided with an anchor portion 359 located on an retainer bracket end opposite to the location of the extended portion 351. The anchor portion 359 is the portion that is to be press fitted into the middle bracket slot 355 and is dimensioned accordingly. The retainer bracket 350 should be made from a material similar to the material used to make the front panel 310 and should be shaped similar to the bracket shown in FIG. 7. Specifically the retainer bracket 350 should be made from steel. It should be appreciated that other bracket material and shape design known to those skilled in the art may also be used.

A middle portion of the circuit board of the front card (not shown) is coupled to the board retainer bracket 350 via the board retainer screw 360 inserted into the threaded hole 353 and a clearance hole in the middle portion of the circuit board. In this way, the board retainer bracket 350 couples the strength of the front panel with its corresponding circuit board to make the front card stronger and to prevent the card from deflecting at the middle portion of the card.

Referring now to FIGS. 3, 5(a)–(b), and 6, a side slot 357 is placed on the left side 314b of the front panel 310. The side slot 357 is designed for easy insertion of the board retainer screw 360 from the left side 314b of the front panel 310. In this embodiment, the side slot 357 is approximately 6.8 mm wide and approximately 3.8 mm deep.

Figure 6:
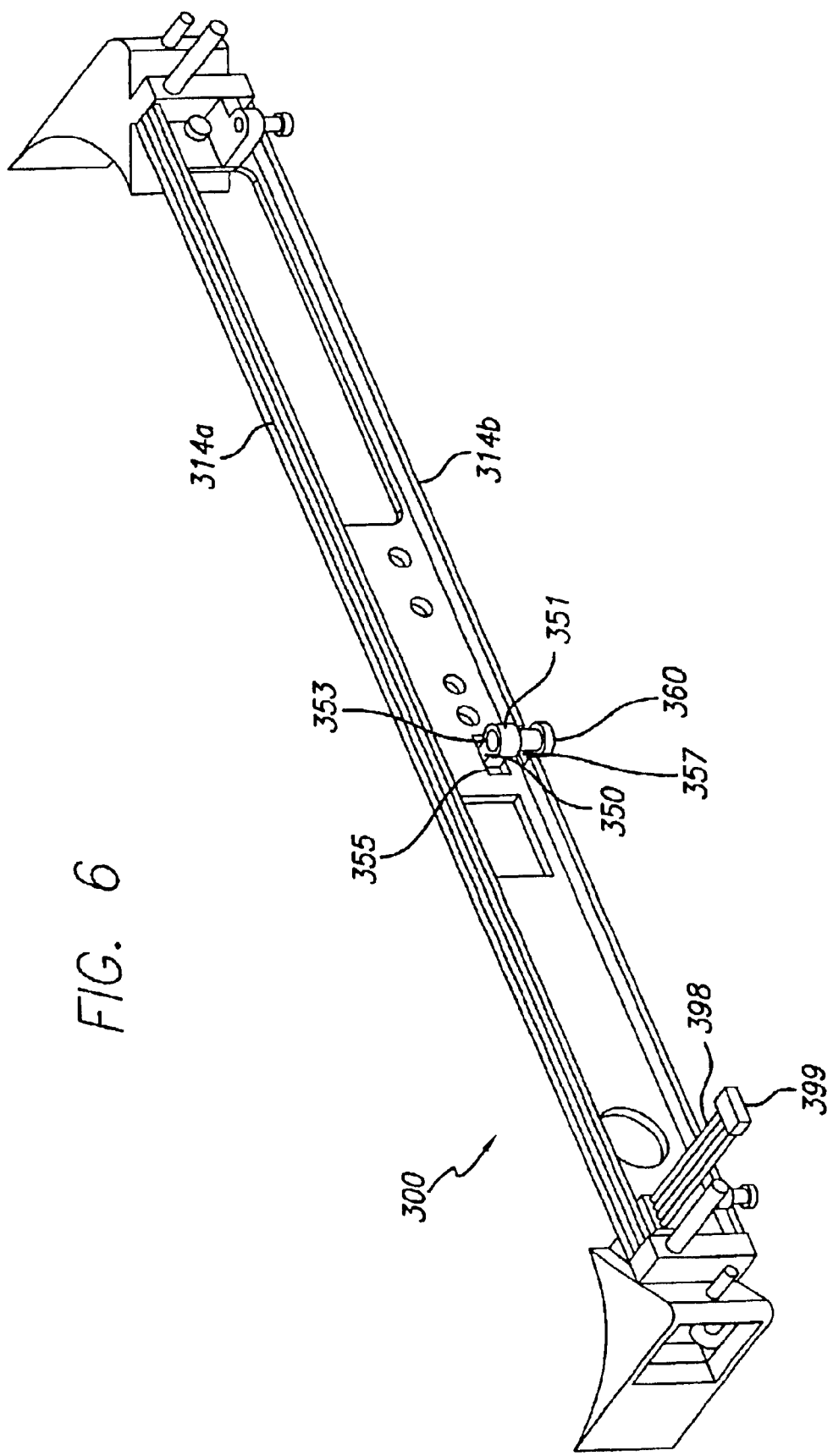
FIG. 6 shows a perspective view of a back face of a cPCI front panel assembly according to an embodiment of the invention.

Lastly, referring now only to FIGS. 3 and 6, the front panel assembly 300 is also electronically connected with its associated cPCI front card's printed circuit board with an electronic connection portion 398. The connection portion 398 is equipped with a three position electrical connector 399 or a Molex plug on one of its ends. The three position electrical connector 399 is designed to be inserted into an electronic receptor located on the front card's printed circuit board. Although, a three position electrical connector 399 is used in this embodiment, other electronic plugs known to those skill in the art may be used in the place of or in addition to the three position electrical connector 399 (to make electronic connection and/or connections).

Having thus described embodiments of the present invention, it should be apparent to those skilled in the art that certain advantages of the within system have been achieved. It should also be appreciated that various modifications, adaptations, and alternative embodiments thereof may be made within the scope and spirit of the present invention. For example, a cPCI front card assembly has been illustrated, but it should be apparent that the inventive concepts described above would be equally applicable to other types of computer card assembly. The invention is further defined by the appended claims.

What is claimed is:

1. A front panel assembly for a printed circuit board of a Compact Peripheral Component Interconnect (cPCI) front card, said front panel assembly comprising:
    a front panel having a first end and a second end;
    a first handle connected with said first end;
    a second handle connected with said second end;
    a first board retainer portion for attaching with an upper portion of the circuit board, said first board retainer portion is located on said first handle;
    a second board retainer portion for attaching with a lower portion of the circuit board, said second board retainer portion is located on said second handle; and
    a board bracket located around a middle portion of said front panel, said board bracket has an anchor portion and an extended portion for attaching with a middle portion of the circuit board;
    wherein said front panel has a slot located around said middle portion of said front panel, wherein said slot is dimensioned for press fitting with said anchor portion of said board bracket, wherein said board bracket is attached to said front panel by press fitting said anchor portion into said slot, and wherein said anchor portion and said extended portion are located on opposite ends of said board bracket.

2. The front panel assembly of claim 1, wherein said front panel further comprises a right side and a left side, and wherein said left side has a side slot.

3. The front panel assembly of claim 2, further comprising a electric/magnetic interference (EMI) shield located on said right side of said front panel.

4. The front panel assembly of claim 3, wherein said board bracket is positioned about 3.7 mm away from said left side of said front panel, said left side contacting a back face of the front card's circuit board after the circuit board has been attached to said front panel.

5. The front panel assembly of claim 1, wherein said front panel is comprised of extruded aluminum.

6. The front panel assembly of claim 1, further comprising a silkscreen on a front face of said front panel.

7. The front panel assembly of claim 1, further comprising an electronic connection portion having an electrical connector for making an electronic connection with the circuit board.

8. The front panel assembly of claim 7, wherein said electrical connector is comprised of a three position electrical connector.

9. The front panel assembly of claim 1, wherein said slot has a rectangular shape.

10. The front panel assembly of claim 1, wherein said slot is positioned below said middle portion of said front panel.

11. The front panel assembly of claim 9, wherein said front panel has a dimension of about 20.3 mm by about 240.4 mm.

12. The front panel assembly of claim 10, wherein said slot is positioned about 103.23 mm above said second end of said front panel.

13. The front panel assembly of claim 1, wherein said board bracket is comprised of steel.

14. The front panel assembly of claim 1, wherein said extended portion has a screw hole for insertion by a board retainer screw.

15. The front panel assembly of claim 14, wherein the middle portion of the circuit board is attached to said board bracket by inserting said board retainer screw into said screw hole and a clearance hole on the middle portion of the circuit board.

16. The front panel assembly of claim 15, wherein said board retainer screw is comprised of a M3×6 mm pan slot screw and wherein said screw hole is threaded.

17. A front panel assembly for a printed circuit board of a Compact Peripheral Component Interconnect (cPCI) front card, said front panel assembly comprising:
    a front panel having a first end, a second end, and a middle portion;
    said first end comprising first attachment means for attaching said first end with an upper portion of the circuit board;
    said second end comprising second attachment means for attaching said second end with a lower portion of the circuit board;
    a board bracket comprising third attachment means for attaching said board bracket with said front panel;
    said board bracket having an extended portion and an anchor portion; and
    said extended portion comprising fourth attachment means for attaching said extended portion with a middle portion of the front card's circuit board;
    wherein said extended portion and said anchor portion are located on opposite ends of said board bracket, wherein said front panel is stronger than the printed circuit board, wherein said front panel has a rectangular shaped slot located below said middle portion of said front panel, wherein said third attachment means comprise press fitting said anchor portion into said rectangular shaped slot, wherein said extended portion has a screw hole for insertion by a board retainer screw, and wherein said fourth attachment means comprise inserting said board retainer screw into said screw hole and a clearance hole on the middle portion of the circuit board.

18. The front panel assembly of claim 17, wherein said front panel further comprises a right side and a left side, and wherein said left side has a side slot.

19. The front panel assembly of claim 18, further comprising a electric/magnetic interference (EMI) shield located on said right side of said front panel.

20. The front panel assembly of claim 19, further comprising an electronic connection portion having means for making an electronic connection with the printed circuit board.

* * * * *